(12) United States Patent
Guha et al.

(10) Patent No.: US 9,178,467 B2
(45) Date of Patent: *Nov. 3, 2015

(54) TRANSPORTABLE PHOTOVOLTAIC SYSTEM

(75) Inventors: Supratik Guha, Chappaqua, NY (US);
Yves C. Martin, Ossining, NY (US);
David B. Mitzi, Mahopac, NY (US);
Robert L. Sandstrom, Chestnut Ridge, NY (US); Theodore G. van Kessel, Millbrook, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 248 days.

This patent is subject to a terminal disclaimer.

(21) Appl. No.: 13/604,147

(22) Filed: Sep. 5, 2012

(65) Prior Publication Data
US 2013/0199597 A1     Aug. 8, 2013

Related U.S. Application Data

(63) Continuation of application No. 13/365,301, filed on Feb. 3, 2012.

(51) Int. Cl.
*H01L 31/00* (2006.01)
*H02S 20/30* (2014.01)
(Continued)

(52) U.S. Cl.
CPC .............. *H02S 20/30* (2014.12); *H02S 20/32* (2014.12); *H01L 31/042* (2013.01); *H01L 31/0547* (2014.12); *H02S 30/20* (2014.12); *Y02E 10/52* (2013.01); *Y10T 29/49355* (2015.01)

(58) Field of Classification Search
CPC . H01L 31/042; H01L 31/0422; H01L 31/045; H02S 20/30–20/32; H02S 30/20
USPC ................................................... 136/244–251
See application file for complete search history.

(56) References Cited

U.S. PATENT DOCUMENTS 3,369,939 A * 2/1968 Myer ........................... 136/246
4,394,529 A   7/1983 Gounder
(Continued)

OTHER PUBLICATIONS

Zakzouk, A.K.M. et al., "Performance Evaluation of Photovoltaic Silicon Cells Under Concentrated Sunlight" IEEE Proceedings (Apr. 1984) pp. 66-72, vol. 131, pt. 1, No. 2.
(Continued)

*Primary Examiner* — Allison Bourke
(74) *Attorney, Agent, or Firm* — Scully, Scott, Murphy & Presser P.C.; Vazken Alexanian

(57) ABSTRACT

A transportable photovoltaic system includes a plurality of photovoltaic devices, a composite frame to which the plurality of photovoltaic devices are affixed, and a base structure to which the composite frame is movably attached through at least one variable-angle mount structure. The orientation of the frame and the light concentrating elements relative to the base structure can be altered employing the at least one variable-angle mount structure. The frame and the plurality of photovoltaic devices can be assembled prior to shipping, and the base structure can be manufactured on site. The transportable photovoltaic system is not affixed to ground or other fixture, but can be picked up at any time during the operational lifetime. The transportable photovoltaic system can be rapidly deployed with little or no site preparation requirement other than generally level ground, and can be retracted to a lower exposure position to avoid storm and/or hazardous conditions.

16 Claims, 19 Drawing Sheets

(51) Int. Cl.
*H01L 31/042* (2014.01)
*H02S 30/20* (2014.01)
*H01L 31/054* (2014.01)

(56) References Cited

U.S. PATENT DOCUMENTS

| | | | | |
|---|---|---|---|---|
| 4,452,234 | A * | 6/1984 | Withjack | 126/627 |
| 5,118,361 | A | 6/1992 | Fraas et al. | |
| 5,379,596 | A * | 1/1995 | Grayson | 62/3.62 |
| 5,969,501 | A | 10/1999 | Glidden et al. | |
| 6,051,776 | A | 4/2000 | Kimata et al. | |
| 6,093,884 | A * | 7/2000 | Toyomura et al. | 136/244 |
| 6,396,239 | B1 * | 5/2002 | Benn et al. | 320/101 |
| 7,381,886 | B1 | 6/2008 | Aiken et al. | |
| 8,492,645 | B1 * | 7/2013 | Strahm | 136/244 |
| 2009/0039705 | A1 * | 2/2009 | Lyman et al. | 307/64 |
| 2009/0188487 | A1 * | 7/2009 | Jones et al. | 126/600 |
| 2010/0050428 | A1 | 3/2010 | Becker et al. | |
| 2010/0089389 | A1 * | 4/2010 | Seery et al. | 126/608 |
| 2010/0218758 | A1 | 9/2010 | Guha et al. | |
| 2010/0218817 | A1 | 9/2010 | Guha et al. | |
| 2011/0011441 | A1 | 1/2011 | Liu | |
| 2011/0062911 | A1 | 3/2011 | Lloyd et al. | |
| 2011/0146751 | A1 * | 6/2011 | McGuire et al. | 136/245 |
| 2011/0290306 | A1 | 12/2011 | Roberts | |
| 2011/0315192 | A1 * | 12/2011 | Swatek et al. | 136/245 |
| 2012/0125405 | A1 * | 5/2012 | Vandermeulen et al. | 136/248 |

OTHER PUBLICATIONS

O'Neill, M.J. et al., "Development of Terrestrial Concentrator Modules Using High-Efficiency Multi-Junction Solar Cells" Conference Record of the 29th IEEE Photovoltaic Specialists Conference (May 19-24, 2002) pp. 1369-1372.

Araki, K. et al., "Development of Concentrator Modules with Dome-shaped Fresnel Lenses and Triple-junction Concentrator Cells" Progress in Photovoltaics: Research and Applications (Sep. 2005) pp. 513-527, vol. 13.

Jaus, J. et al., "Reflective Secondary optical Elements for Fresnel Lens Based Concentrator Modules" Progress in Photovoltaics: Research and Applications (Mar. 3, 2011) 11 pages.

Feuermann, D. et al., "High-Concentration Photovoltaic Designs Based on Miniature Parabolic Dishes" Proceedings of SPIE (Nov. 19, 2001) pp. 43-51, vol. 4446.

International Search Report dated Mar. 13, 2013, issued in International Application No. PCT/US12/70279.

Office Action dated Sep. 24, 2014 received in U.S. Appl. No. 13/365,301.

* cited by examiner

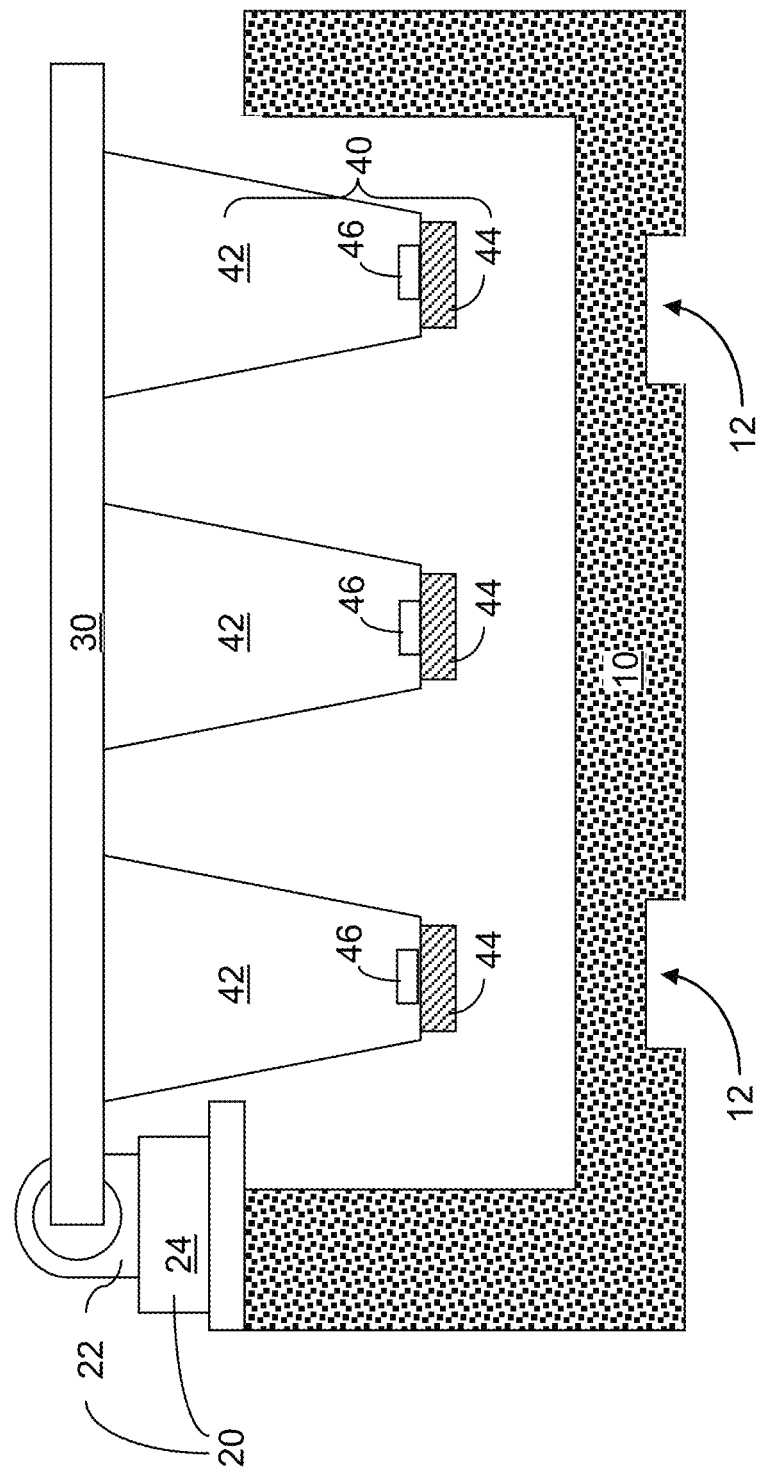

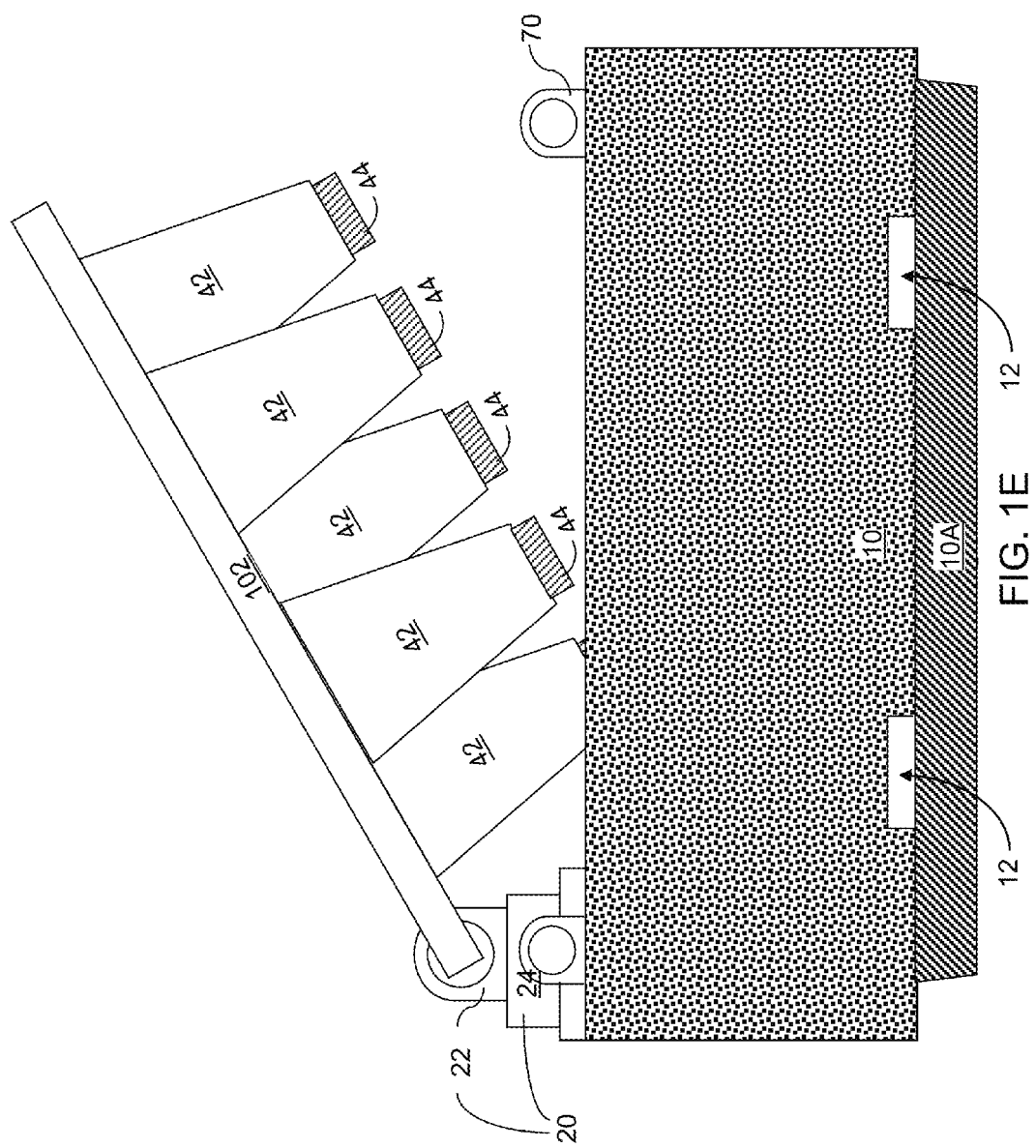

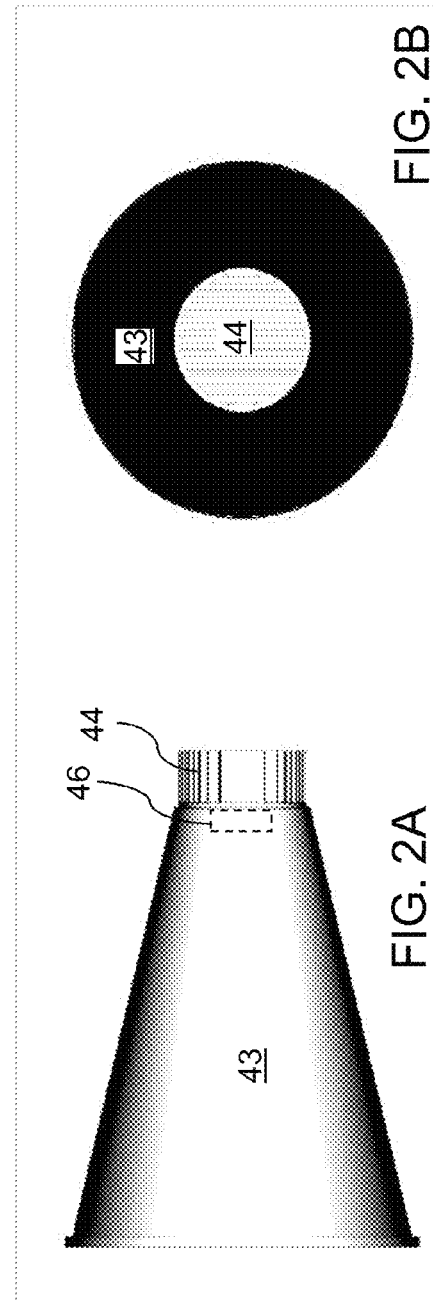
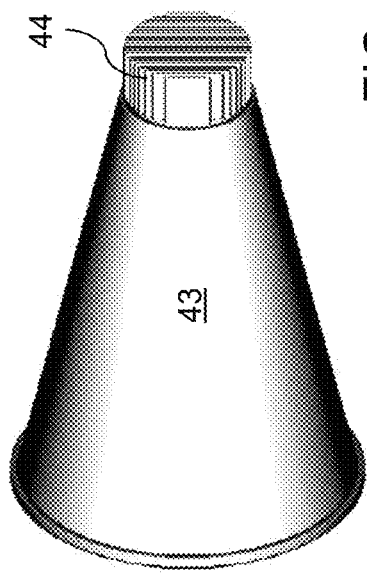
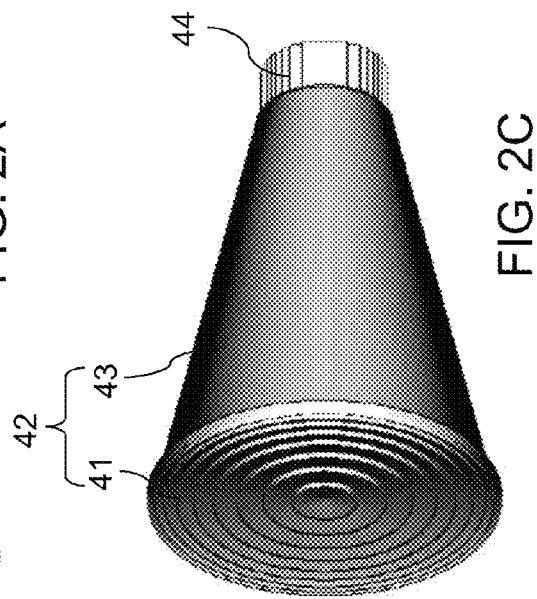
FIG. 2A
FIG. 2B
FIG. 2C
FIG. 2D

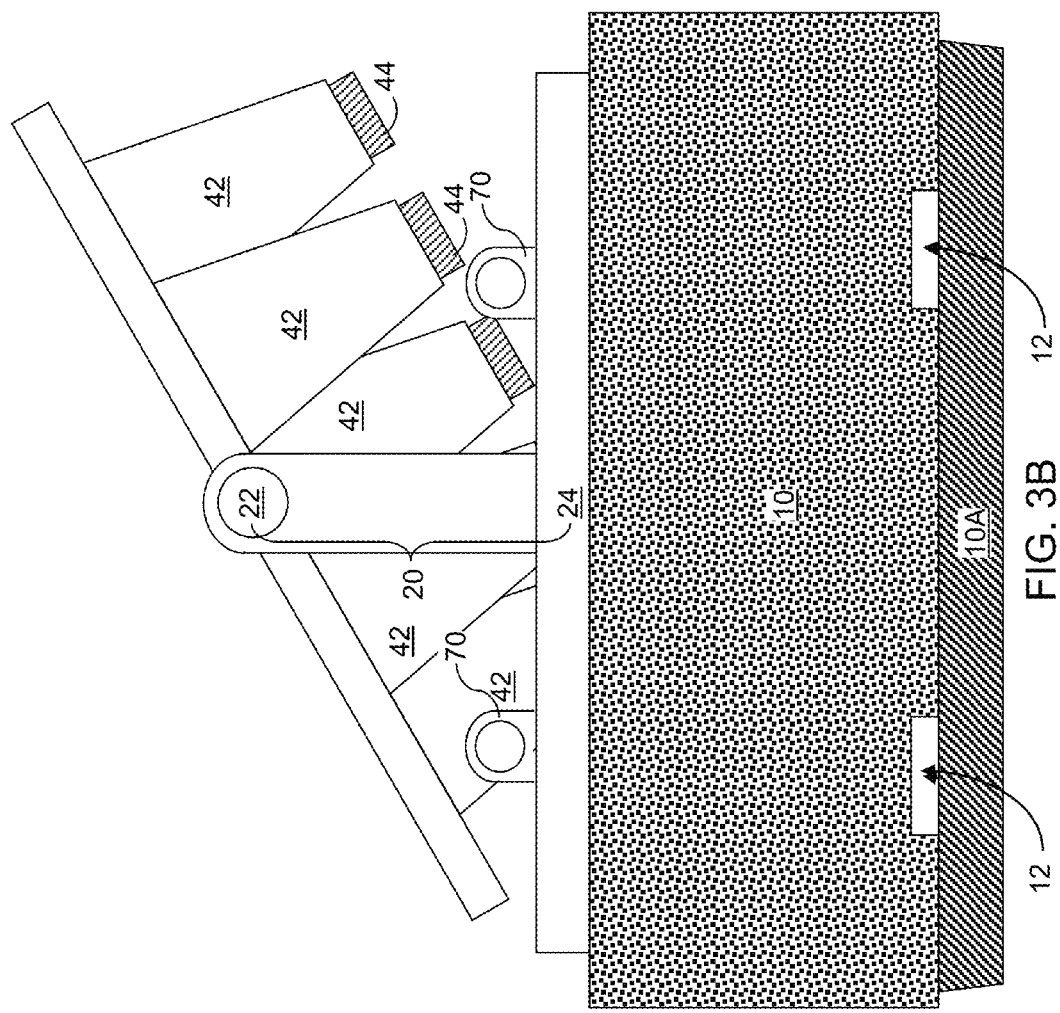

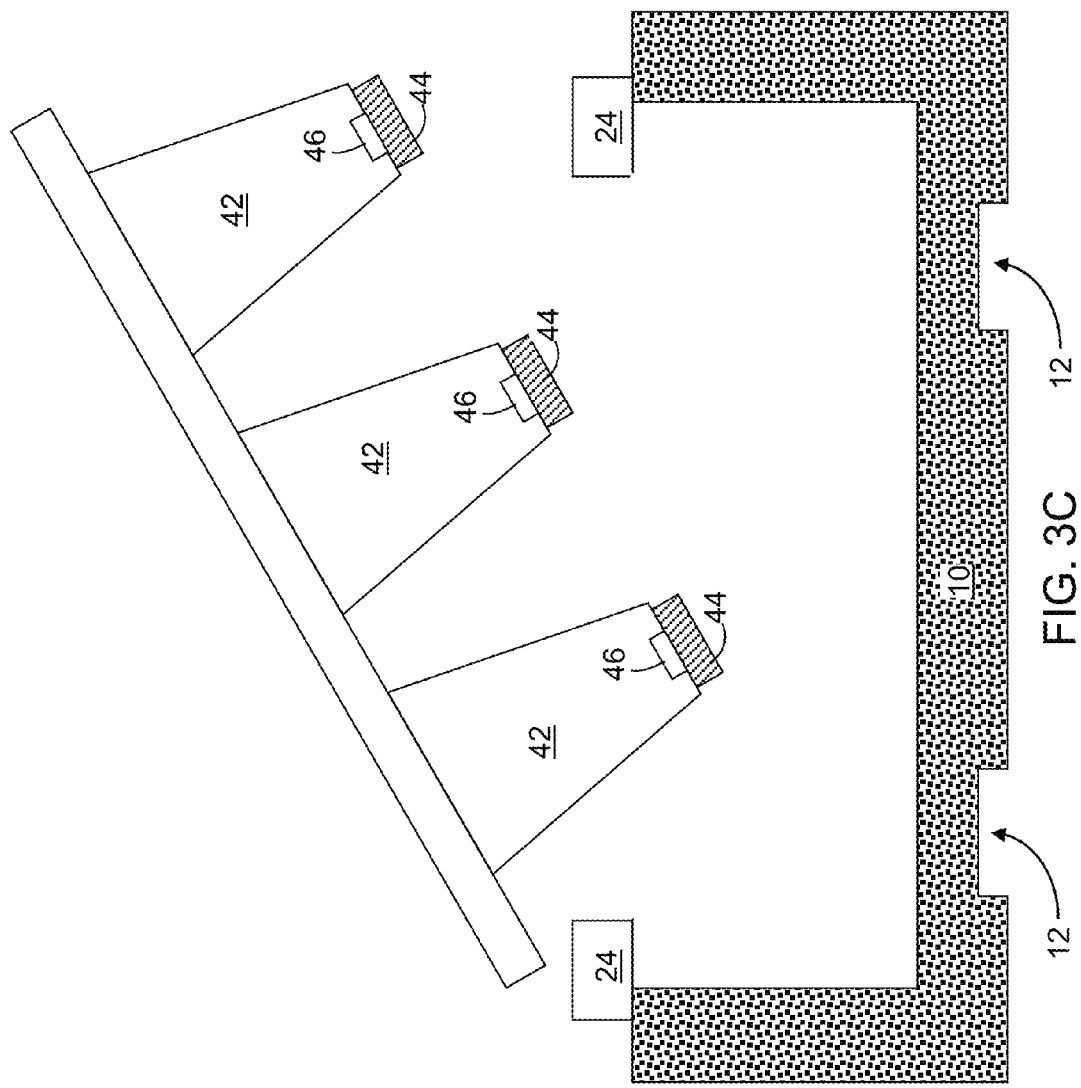

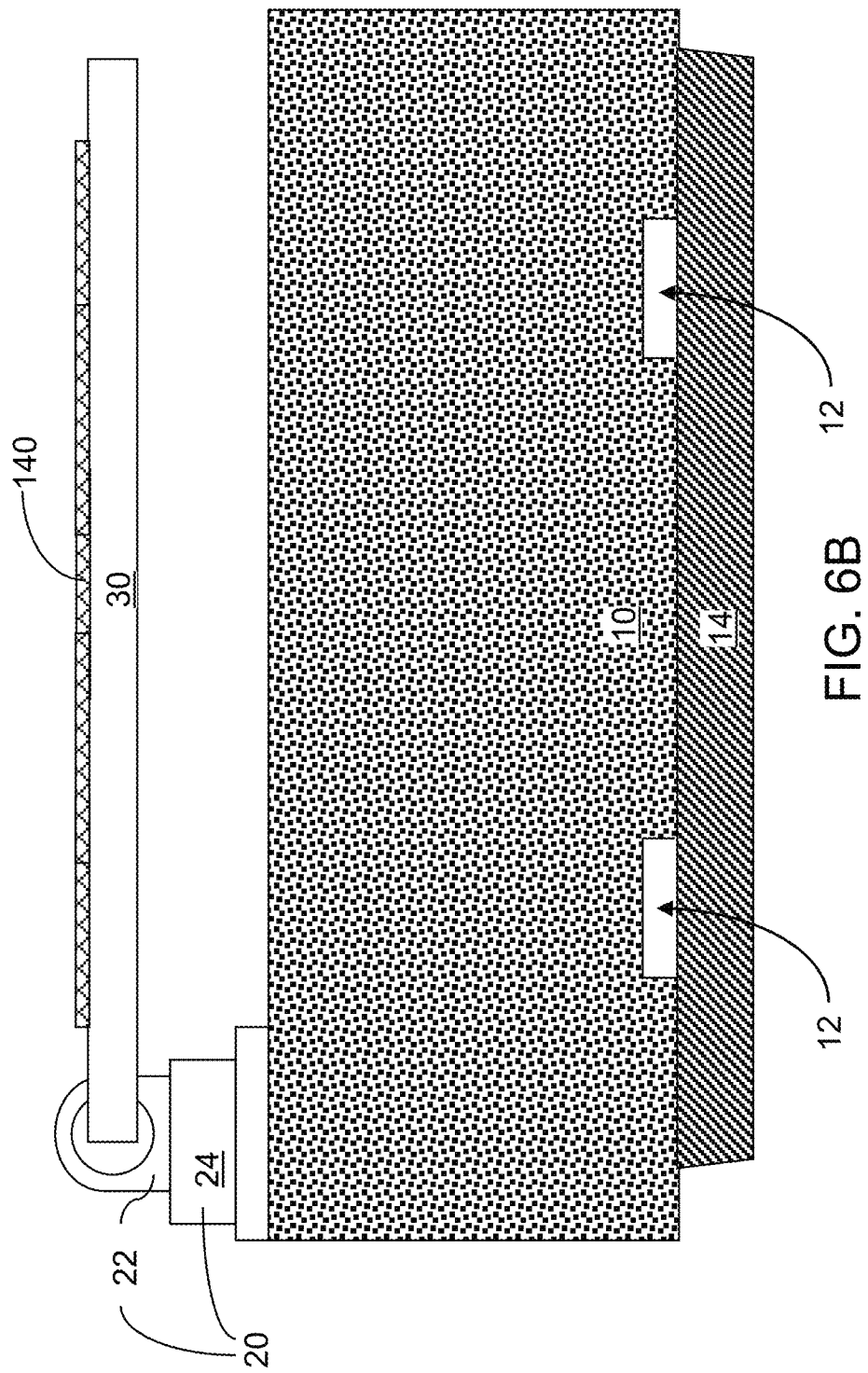

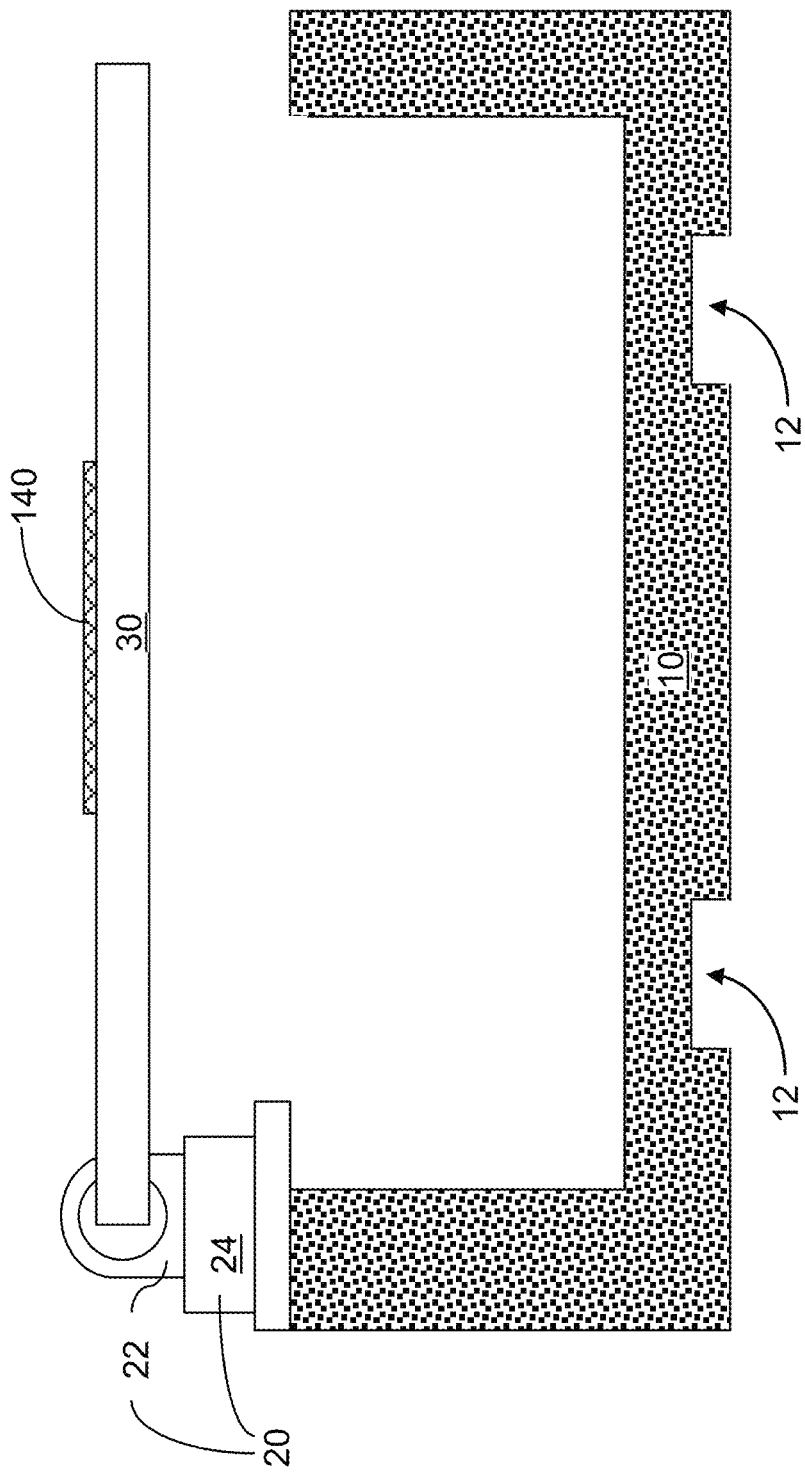

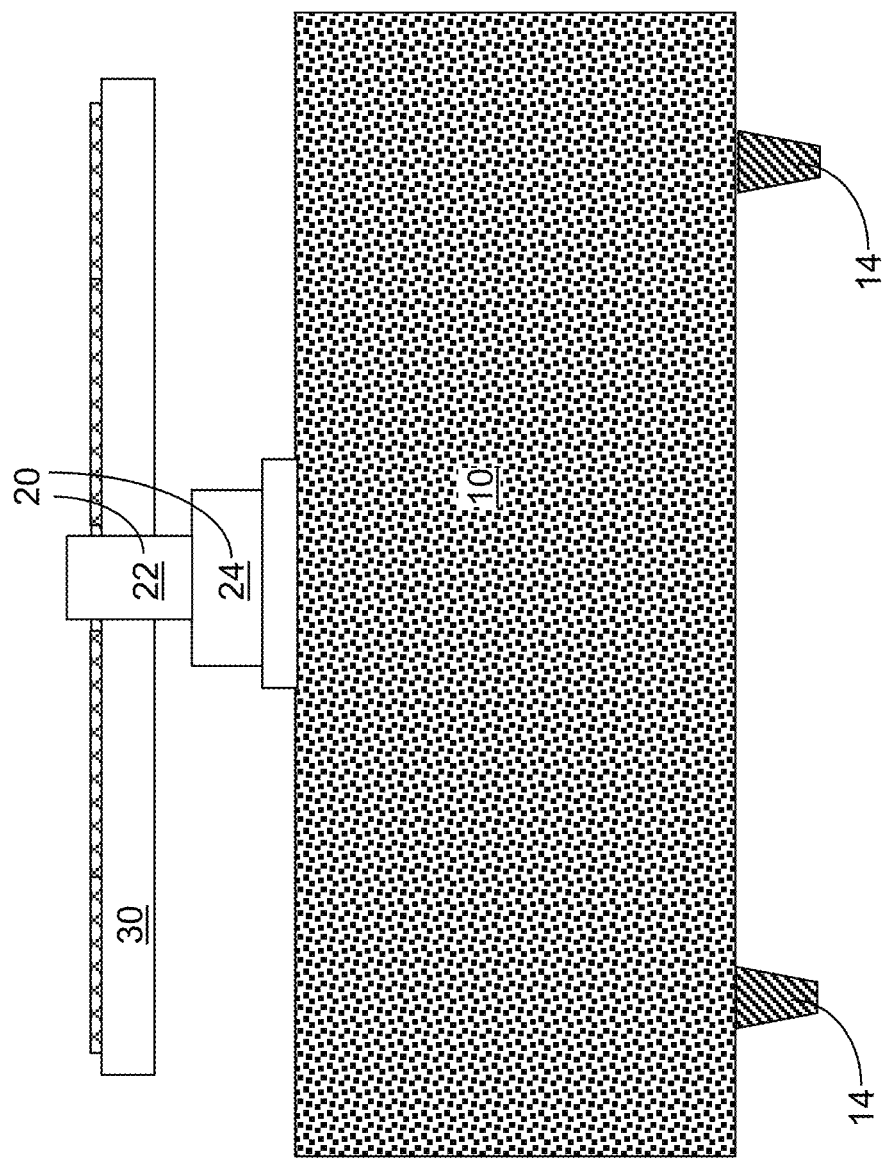

TRANSPORTABLE PHOTOVOLTAIC SYSTEM

CROSS REFERENCE TO RELATED APPLICATION

This application is a continuation of U.S. patent application Ser. No. 13/365,301 filed Feb. 3, 2012 the entire content and disclosure of which is incorporated herein by reference.

BACKGROUND

The present disclosure relates to solar concentrators, and more particularly to a transportable photovoltaic system configured for rapid deployment and methods of operating the same.

Solar concentrators allow replacement of large quantities of expensive semiconductor materials used in fixed flat panel systems with less expensive materials so that light can be concentrated on a smaller high power semiconductor photovoltaic device to achieve comparable performance at a lower cost. Varieties of solar concentrator photovoltaic systems have been constructed and deployed that range from small rooftop systems producing a few watts to very large concentrators producing thousands of watts of power.

Once deployed, the solar concentrator photovoltaic systems must tolerate exposure to temperature extremes, dust, rain, hail and high winds. The ability to tolerate gusts of 140 miles per hour is a common requirement. Power inversion from direct current (DC) to alternating current (AC) is typically performed by connecting many concentrators systems into a single inverter operating at up to many thousands of watts. In more recent embodiments, micro inverters have been introduced that will grid couple smaller solar collectors operating at powers of 100 W to 500 W.

A significant cost component in many current systems is the cost for on site assembly and extensive site preparation. Concentrator systems are constructed in component form and shipped to the site for assembly. On site preparation includes grading, excavation and pouring of foundations. Once a solar concentrator photovoltaic system is constructed at a location, the solar concentrator photovoltaic system remains at that location throughout the duration of the lifetime of the solar concentrator photovoltaic system.

SUMMARY

A transportable photovoltaic system includes a plurality of photovoltaic devices, a composite frame to which the plurality of photovoltaic devices are affixed, and a base structure to which the composite frame is movably attached through at least one variable-angle mount structure. The orientation of the frame and the light concentrating elements relative to the base structure can be altered employing the at least one variable-angle mount structure. The frame and the plurality of photovoltaic devices can be assembled prior to shipping, and the base structure can be manufactured on site. The transportable photovoltaic system is not affixed to ground or other fixture, but can be picked up at any time during the operational lifetime. The transportable photovoltaic system can be rapidly deployed with little or no site preparation requirement other than generally level ground, and can be retracted to a lower exposure position to avoid storm and/or hazardous conditions. Further, the transportable photovoltaic system can be manufactured at a low cost, and can be configured for shipment in standard shipping containers for rapid and economical transportation.

According to an aspect of the present disclosure, a method of operating a plurality of photovoltaic devices is provided. The method includes: mounting a plurality of photovoltaic devices to a frame; forming an assembly by attaching the frame to a base unit through at least one variable-angle mount structure, wherein the variable-angle mount structure is configured to rotate the frame around at least one axis; and placing the base unit on a horizontal surface without affixing the base unit to the horizontal surface at a location.

According to another aspect of the present disclosure, a transportable photovoltaic structure is provided, which includes an assembly of: a plurality of photovoltaic devices mounted to a frame; and a base unit attached to the frame through at least one variable-angle mount structure, wherein the variable-angle mount structure is configured to rotate the frame around at least one axis, and the base unit is configured to be placed on a horizontal surface without being affixed to the horizontal surface.

BRIEF DESCRIPTION OF SEVERAL VIEWS OF THE DRAWINGS

FIG. 1C is a vertical cross-sectional view of the first exemplary solar concentrator photovoltaic assembly in the retracted position along the plane C-C' in FIG. 1A according to an embodiment of the present disclosure.

FIG. 1E is a side view of the first exemplary solar concentrator photovoltaic assembly in a tilted position according to an embodiment of the present disclosure.

FIGS. 2A-2D are views of a solar concentrator photovoltaic device at various viewing angles.

FIG. 3B is a side view of the second exemplary solar concentrator photovoltaic assembly in the tilted position according to an embodiment of the present disclosure.

FIG. 3C is a vertical cross-sectional view of the second exemplary solar concentrator photovoltaic assembly in the tilted position along the plane C-C' in FIG. 3A according to an embodiment of the present disclosure.

FIG. 6B is a side view of the exemplary flat panel photovoltaic assembly in the retracted position according to an embodiment of the present disclosure.

FIG. 6C is a vertical cross-sectional view of the exemplary flat panel photovoltaic assembly in the retracted position along the plane C-C' in FIG. 6A according to an embodiment of the present disclosure.

FIG. 6D is a front view of the exemplary flat panel photovoltaic assembly in the retracted position according to an embodiment of the present disclosure.

DETAILED DESCRIPTION

Figure 1A:
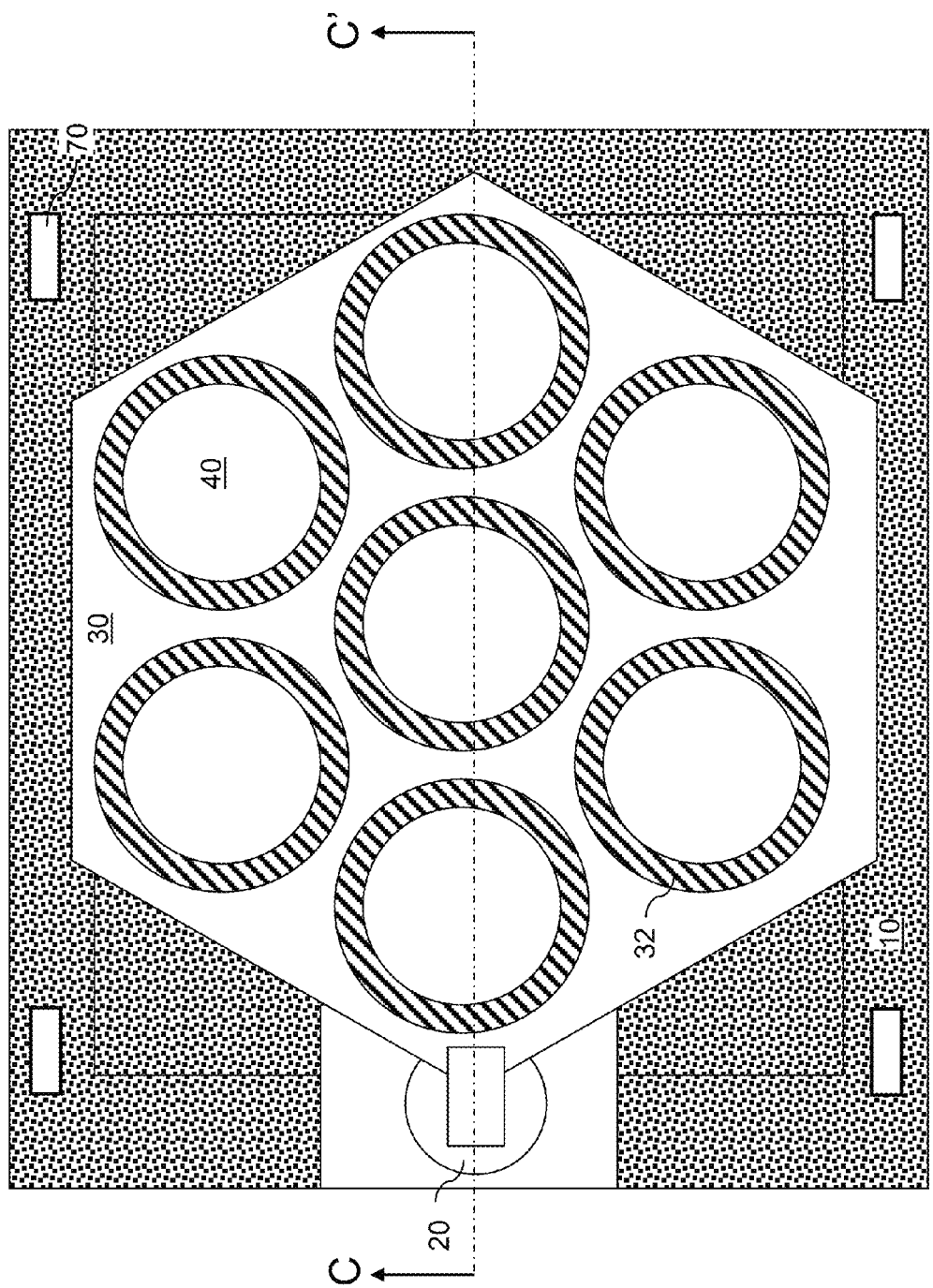
FIG. 1A is a top-down view of a first exemplary solar concentrator photovoltaic assembly in a retracted position according to an embodiment of the present disclosure.

As stated above, the present disclosure relates to a transportable photovoltaic system configured for rapid deployment and methods of operating the same, which are now described in further detail with accompanying figures. Throughout the drawings, the same reference numerals or letters are used to designate like or equivalent elements. The drawings are not necessarily drawn to scale.

As used herein, a "photovoltaic" element is an element that is configured to generate electricity from electromagnetic radiation in the visible range, infrared range, or ultraviolet range.

As used herein, a "solar concentrator" is a device that is configured to focus a substantially parallel beam, such as solar radiation, to a focus on a photovoltaic element using a lens or a mirror.

As used herein, a "solar concentrator photovoltaic" element is a photovoltaic element that includes at least one solar concentrator.

As used herein, a "flat panel photovoltaic" element is a photovoltaic element that does not employ any solar concentrator.

As used herein, a "transportable" element is an element that is not permanently affixed to ground or any other fixture, and can be transported in commercial shipping vehicles such as a truck, a cargo ship, or a cargo plane after a pick up employing commercial construction equipment such as a crane or a forklift or by manual means.

Figure 1B:
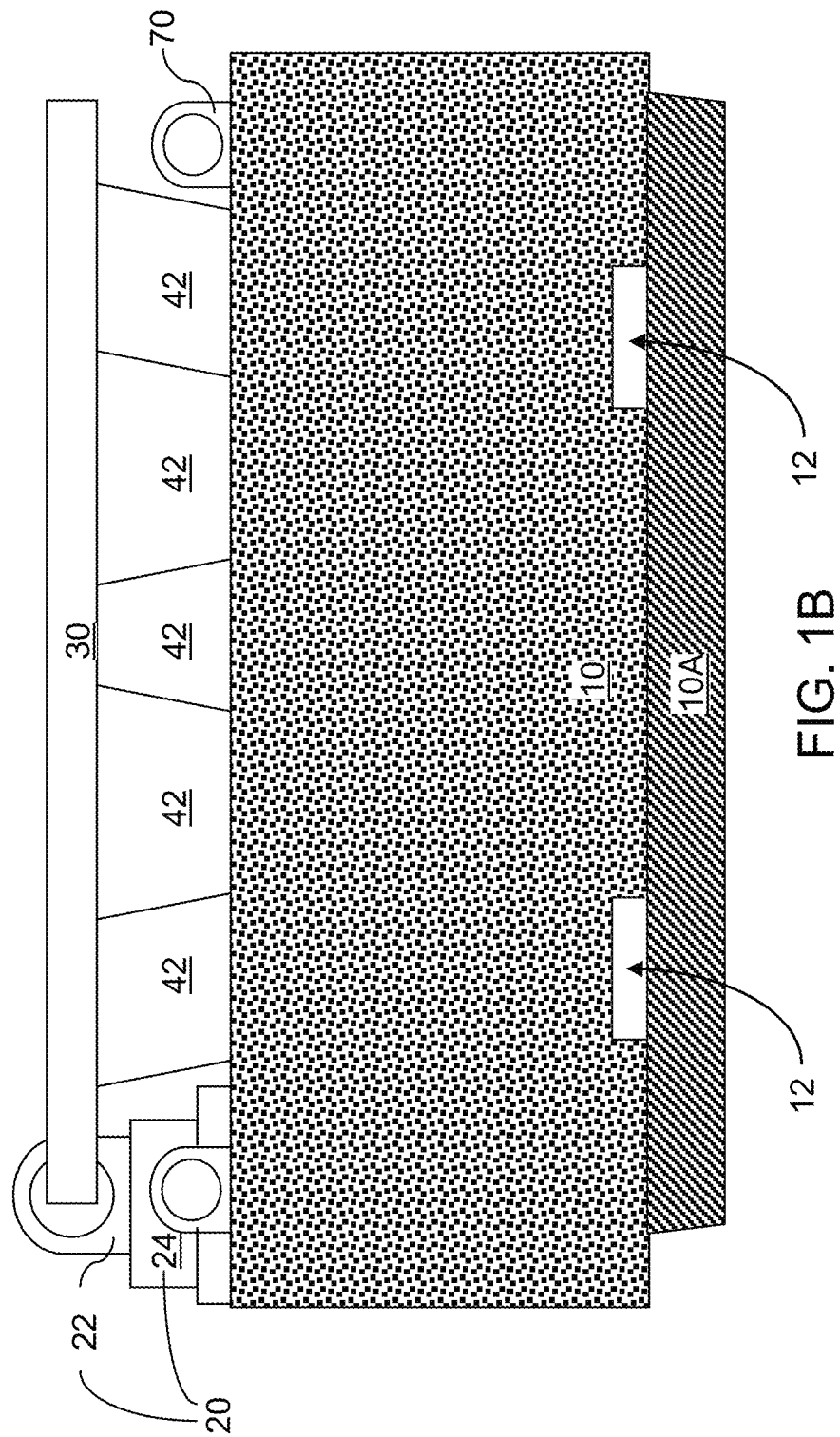
FIG. 1B is a side view of the first exemplary solar concentrator photovoltaic assembly in the retracted position according to an embodiment of the present disclosure.
Figure 1D:
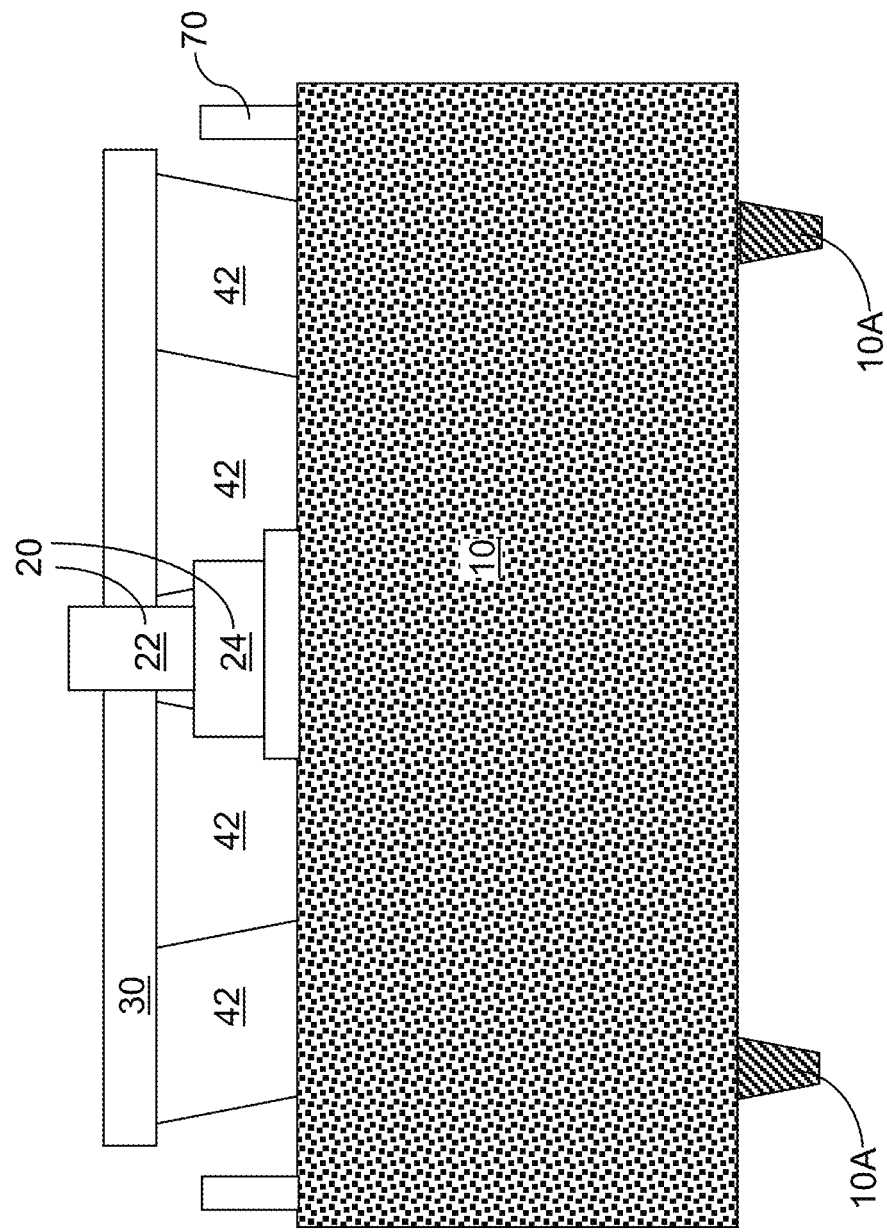
FIG. 1D is a front view of the first exemplary solar concentrator photovoltaic assembly in the retracted position according to an embodiment of the present disclosure.
Figure 1F:
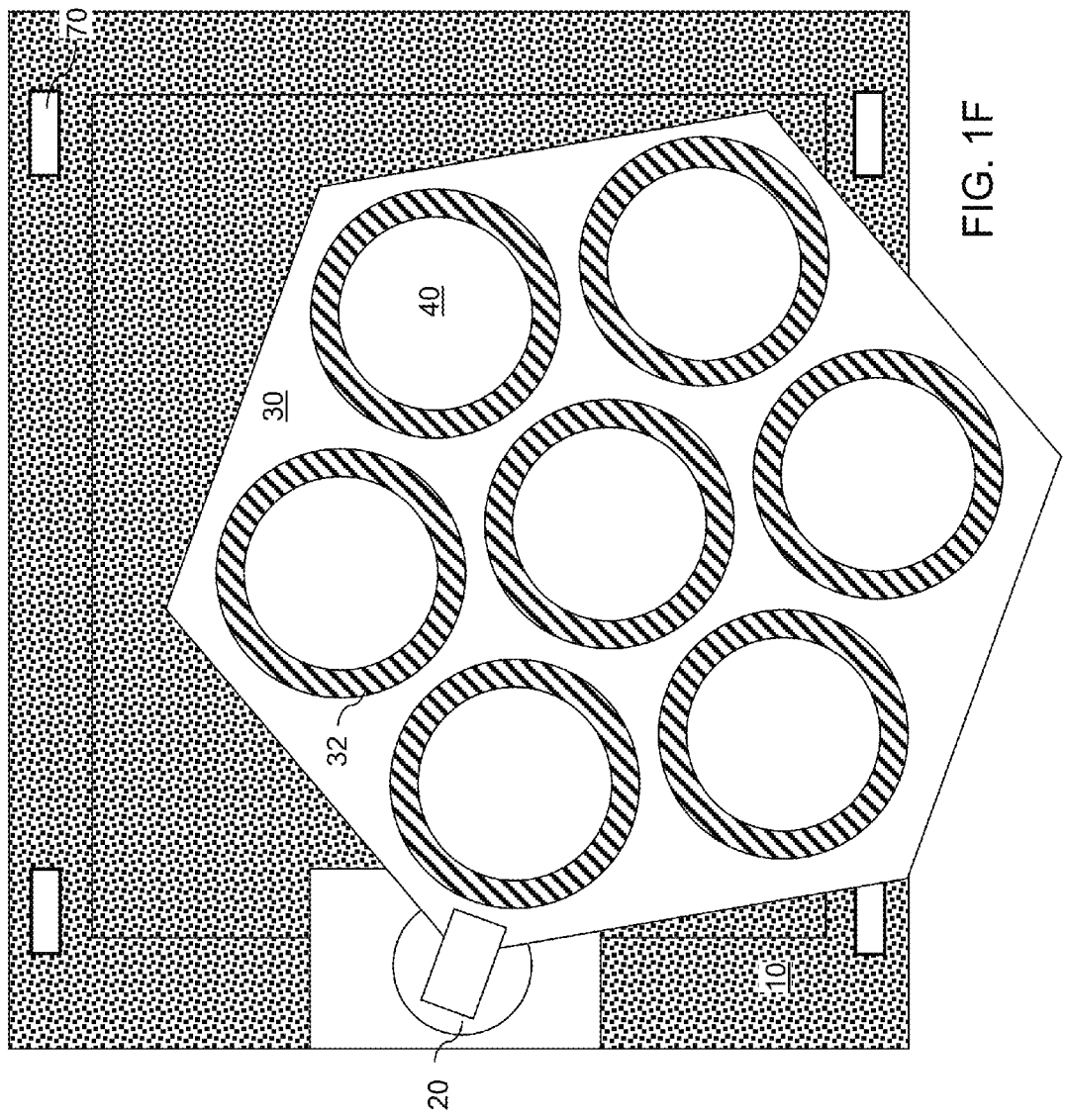
FIG. 1F is a top-down view of the first exemplary solar concentrator photovoltaic assembly in an azimuthally rotated position according to an embodiment of the present disclosure.

Referring to FIGS. 1A-1F, a first exemplary solar concentrator photovoltaic assembly according to an embodiment of the present disclosure is illustrated. The first exemplary solar concentrator photovoltaic assembly is a transportable photovoltaic system. FIGS. 1A-1D illustrate the first exemplary solar concentrator photovoltaic assembly in a retracted position in which the first exemplary solar concentrator photovoltaic assembly is most compact. FIG. 1B is a side view, FIG. 1C is a vertical cross-sectional view along the plane C-C' in FIG. 1A, and FIG. 1D is a front view of the first exemplary solar concentrator photovoltaic assembly in the retracted position. FIG. 1E illustrates the first exemplary solar concentrator photovoltaic assembly in a tilted position in which the top surface of a frame 30 is at a non-zero angle from a vertical line. FIG. 1F illustrates the first exemplary solar concentrator photovoltaic assembly in an azimuthally rotated position in which the frame 30 is rotated around an axis that is not parallel to a horizontal plane. This axis of rotation is vertical in FIG. 1F. In general, the frame 30 of the first exemplary solar concentrator photovoltaic assembly can be tilted and rotated by two independent angles.

The first exemplary solar concentrator photovoltaic assembly comprises a plurality of solar concentrator photovoltaic devices 40 that are mounted on a frame 30. The frame 30 is configured to hold the plurality of solar concentrator photovoltaic devices 40 through mounting structures 32, which can be separate structures that are attached to the frame 30 or can be structures that are integrally formed with the frame, viz. as components of the frame 30. For example, the mounting structures 32 can be a set of bolts and corresponding threaded holes. The plurality of solar concentrator photovoltaic devices 40 are thus mechanically affixed to the frame 30. The solar concentrators shown in these illustrations employ round lenses. We note that In alternate embodiments the lens or minors may be individual units or square, rectangular and hexagonal shape. We further note that in alternate embodiments individual lens or minor elements may be combined into a single unit or parquet arrangement.

Referring to FIGS. 2A-2D, an example of a solar concentrator photovoltaic device 40 is shown at various viewing angles. Each solar concentrator photovoltaic device 40 can include a solar concentrator 42, a heat sink 44, and a photovoltaic cell 46. The solar concentrator 42 is configured to focus a substantially parallel radiation in the visible range, in the infrared range, and/or in the ultraviolet range onto the photovoltaic cell 46 within the same solar concentrator photovoltaic device 40. The plurality of solar concentrators 42 are mounted on the frame 30 and over the plurality of photovoltaic cells 46 so that solar radiation incident on the top surfaces of the plurality of solar concentrators 42 is focused onto the plurality of photovoltaic cells 46. In one embodiment, the solar concentrator 42 can include a lens 41 and/or a mirror (not shown) that is/are configured to focus light onto the photovoltaic cell located within the same solar concentrator photovoltaic device 40. The lens 41 of a solar concentrator 42, (a) side panel(s) 43 of the solar concentration 42, and a back side panel of the solar concentrator 42 can provide an enclosure. In one embodiment, the back side panel of the solar concentrator 42 can be covered by, or replaced with, the heat sink 44. The location of a photovoltaic cell 46 is schematically illustrated in FIG. 2A. In one embodiment, the plurality of solar concentrators 42 can be configured to provide most efficient focusing when the solar radiation impinges onto the top surfaces of the solar concentrators 42 at normal incidence, i.e., in a direction perpendicular to the top surfaces of the solar concentrators 42.

In one embodiment, at least one of the plurality of solar concentrators 42 includes a Fresnel lens, a conductive enclosure, and the heat sink 44. At least one of the plurality of photovoltaic cells 46 is located at a focal point of said Fresnel lens. For example, a solar concentrator 42 can include sidewalls of a spun aluminum cone, and can include a Fresnel lens (not show) affixed with adhesive to the spun aluminum cone. The length of the spun aluminum cone can be equal to the sum of the focal length of a lens or a lens system included therein and the thickness of a photovoltaic cell 46 therein. In alternate embodiments the solar concentrator may comprise an array of lenses affixed to a single enclosure with the photovoltaic elements affixed to the back of said enclosure. In this case the enclosure may comprise a conductive structural material such as aluminum to dissipate heat and may further comprise multiple heat sink elements affixed to the enclosure to further dissipate heat.

The photovoltaic cells 46 can be any type of photovoltaic cells known in the art. In one embodiment, the photovoltaic cells 46 can be multijunction cells having different photovoltaic junctions optimized for absorbing photons in different wavelength ranges. The multiple photovoltaic junctions are located at different depths from the topmost surfaces of the photovoltaic cells 46. In one embodiment, each area of the photovoltaic cell 46 can be illuminated by roughly equal amounts of the solar rays in the multiple spectral regions.

The heat sink 44 is configured to dissipate the heat generated from the energy focused onto the photovoltaic cell 46 and not converted into electricity. The heat sink 44 may optionally include fins and/or a fan to facilitate heat dissipation. The heat sink 44 can be mechanically and thermally coupled to the spun aluminum cone. The heat sink 44 can also be affixed to the photovoltaic 46 employing any methods known in the art including a conductive paste, screws, bolts and nuts, etc.

The frame 30 is a structure configured to hold the plurality of solar concentrator devices 40. The frame 30 can include a composite light weight material such as fiberglass including glass fibers and epoxy, composite carbon fiber including carbon fibers embedded in an epoxy matrix, or any other light weight material that can provide sufficient mechanical strength to hold the plurality of solar concentrator photovoltaic devices 40. The frame 30 provides structural support to the plurality of solar concentrator photovoltaic devices 40. The shape and size of the frame 30 are selected to mount the plurality of solar concentrator devices 40. In the first exemplary solar concentrator photovoltaic assembly, seven solar concentrator photovoltaic devices 40 are arranged on a hexagonal frame, which functions as a support plate. In alternate embodiment the frame may comprise a metal such as aluminum, steel, magnesium and titanium. Combinations of metal and composite materials may be employed to further improve strength to weight performance.

The frame 30 is attached to a base unit 10 through at least one variable-angle mount structure 20. The at least one variable-angle mount structure 20 is configured to rotate the frame 30 around at least one axis relative to the base unit 10. Each of the at least one variable-angle mount structure 20 can include a powered actuator, which can be an electrically powered strut, a hydraulically powered strut, a pneumatically powered strut, and/or a combination thereof. Each of the variable-angle mount structure 20 can include a hinge, or any other mechanically equivalent mechanical structure that enable rotation of a first element attached to a first component of the variable-angle mount structure 20 relative to a second element attached to a second component of the variable-angle mount structure 20. The combination of a hinge (or an equivalent structure) and a powered actuator enables change of the at least one angle between the base unit 10 and the frame 30.

The at least one variable-angle mount structure 20 can include a tilt angle adjustment mount structure 22 configured to raise or lower the center of gravity of the combination of the frame 30 and the plurality of solar concentrator photovoltaic devices 40. Additionally or alternately, the at least one variable-angle mount structure 20 can include an azimuthal angle adjustment mount structure 24 configured to rotate the combination of the frame 30 and the plurality of solar concentrator photovoltaic devices 40 within a plane in which the center of gravity of the combination (30, 40) remains at a same distance from a horizontal plane that is coplanar with a bottom surface of the base unit 10.

The base unit 10 is configured to be placed on a horizontal surface, such as leveled ground, without being affixed to the horizontal surface. The first exemplary solar concentrator photovoltaic assembly is not attached to any structure contiguously extending below the horizontal surface. The base unit 10 includes a heavy material that can be assembled on site, i.e., at a location of a first operation of the first exemplary solar concentrator photovoltaic assembly. In one embodiment, the base unit 10 includes a heavy material that can provide sufficient weight to the first exemplary solar concentrator photovoltaic assembly. The base unit 10 can be made of, for example, cast concrete.

In one embodiment, the frame 30 can include a material having a first average density, and the base unit 10 can include another material having a second average density such that the second average density is greater than the first average density. The material of the frame 30 can be, but need not be, a composite material including fibers and a matrix material in which the fibers are embedded. For example, the frame 30 can include fiberglass (having a density of about 1.5 grams/cm$^3$) or composite carbon fiber (having a density of about 1.3 grams/cm$^3$), and the base unit can be made of cast concrete (having a density of about 2.4 grams/cm$^3$). Alternatively or additionally, the frame 30 can include one or more of steel, aluminum, magnesium, and titanium.

In the first exemplary solar concentrator photovoltaic assembly, the base unit 10 can have a shape of a hollow square box without a top surface so that the plurality of solar concentrator photovoltaic devices 40 can be protected from hazardous environmental conditions (such as a hurricane or a heavy snowfall) in a retracted position, as well as minimizing a total volume of a package including the first exemplary solar concentrator photovoltaic assembly during a shipment from an original site (at which the base unit 10 is first attached to the combination of the frame 30 and the plurality of solar concentrator photovoltaic devices 40 through that at least one variable-angle mount structure 20) to another location.

The first exemplary solar concentrator photovoltaic assembly can be employed to operate the plurality of photovoltaic cells 46 therein in an efficient manner with minimal prior notice or preparation. First, a plurality of solar concentrator photovoltaic devices 40 is attached to a frame 30. For example, the plurality of solar concentrator photovoltaic devices 40 can be mounted to the frame 30 to form a first assembly of the frame 30 and the plurality of solar concentrator photovoltaic devices 40 at a first location, which can be a centralized manufacturing facility. The base unit 10 can be manufactured at a second location, which can be the site of installation for the first exemplary solar concentrator photovoltaic assembly. Thus, the second location can be different from the first location.

The first assembly of the frame 30 and the plurality of solar concentrator photovoltaic devices 40 mounted thereupon can be transported on a wheeled vehicle such as a truck, a waterway-navigating vehicle such as a ship or a boat, or a flying vehicle such as a commercial freight plane from the first location to the second location. Subsequently, the first assembly (30, 40) can be attached to a base unit 10 at the second location to form a second assembly, which includes the first assembly (30, 40) and the base unit 10. The at least one variable-angle mount structure 20 may be mounted on the first assembly (30, 40) prior to shipping from the first location to a second location, or may be attached to the first assembly (30, 40) and the base unit 10 at the second site. The at least one variable-angle mount structure 20 may be shipped to the second site with the first assembly (30, 40), or may be shipped to the second site in a different shipment. In one embodiment, the at least one variable-angle mount structure 20 may be assembled at a third site different from the first site and the second site, and be shipped to the second site for attachment to the first assembly (30, 40) and to the base unit 10 at the second site.

Thus, an assembly, i.e., the second assembly, is formed by attaching the frame 30 to the base unit 10 through the at least one variable-angle mount structure 20. As discussed above, the at least one variable-angle mount structure 20 is configured to rotate the frame 30 around at least one axis.

The base unit 10 can be placed on a horizontal surface at a location at which the first exemplary solar concentrator photovoltaic assembly becomes operational for the first time, i.e., at a location at which the first exemplary solar concentrator photovoltaic assembly generates electricity from solar radiation. The placement of the base unit 20 at the location at which the first exemplary solar concentrator photovoltaic assembly becomes operational can be performed prior to, or after, the attachment of the first assembly (30, 40) to the base unit 10 through the at least one variable-angle mount structure 20.

The base unit 10 is not affixed to the horizontal surface at the location at which the first exemplary solar concentrator photovoltaic assembly becomes operational. The feature of not affixing the base unit 10, or any component of the first exemplary solar concentrator photovoltaic assembly, to ground, any surface, or any other fixture enables the first exemplary solar concentrator photovoltaic assembly to be transportable. The first exemplary solar concentrator photovoltaic assembly remains in any place by weight and gravity, and can be moved by typical construction equipment or by a group of 2-3 workers.

Once the first exemplary solar concentrator photovoltaic assembly is fully assembled and the base unit 10 is placed at the location of the first operational site, electricity can be generated from the plurality of solar concentrator photovoltaic devices 40 while the base unit 10 is placed at the location.

During the operation of the first exemplary solar concentrator photovoltaic assembly in which electricity is generated from the plurality of solar concentrator photovoltaic devices 40 generates electricity from solar radiation, the frame 30 and the plurality of solar concentrator photovoltaic devices 40 mounted thereupon can be rotated, employing the at least one variable-angle mount structure 20, to change the tilt angle of the frame 30 and the plurality of solar concentrator photovoltaic devices 40 mounted thereupon, i.e., in a direction that changes an angle between a horizontal plane and a plane of top surfaces of the plurality of solar concentrator photovoltaic devices 40. For example, the tilt angle adjustment mount structure 22 can be employed to raise or lower the center of gravity of the combination of the frame 30 and the plurality of solar concentrator photovoltaic devices 40.

Further, during the operation of the first exemplary solar concentrator photovoltaic assembly in which electricity is generated from the plurality of solar concentrator photovoltaic devices 40 generates electricity from solar radiation, the frame 30 and the plurality of solar concentrator photovoltaic devices 40 mounted thereupon can be rotated, employing the at least one variable-angle mount structure 20, to change the azimuthal angle of the frame 30 and the plurality of solar concentrator photovoltaic devices 40 mounted thereupon, i.e., around a direction that is perpendicular to a plane of the top surfaces of the plurality of solar concentrator photovoltaic devices 40. For example, the azimuthal angle adjustment mount structure 24 can be employed to rotate the combination of the frame 30 and the plurality of solar concentrator photovoltaic devices 40 within a plane in which the center of gravity of the combined structure of the frame 30 and the plurality of solar concentrator photovoltaic devices 40 remains at a same distance from the horizontal plane that is coplanar with the bottom surface of the base unit 10, which can be substantially level if in physical contact with a level ground.

Because the first exemplary solar concentrator photovoltaic assembly is not affixed to ground, any horizontal surface, or any other fixture that does not move relative to ground, a construction equipment operator or a group of workers can slide the first exemplary solar concentrator photovoltaic assembly over the horizontal surface at which the base unit 10 is initially placed. The first exemplar solar concentrator photovoltaic assembly stays at a location through friction. The first exemplar solar concentrator photovoltaic assembly is thus slidable over the horizontal surface if a total sum of lateral forces can overcome the friction. Thus, first exemplar solar concentrator photovoltaic assembly is slidable with typical construction equipment such as a bulldozer or with sufficient manpower.

In one embodiment, the base unit 10 can include features that enhance transportability of the first exemplary solar concentrator photovoltaic assembly. For example, the bottom portion of the base unit 10 can include a skid 10A that is of contiguous and integral construction with other portions of the base unit 10. In other words, the skid 10A is an optional component of the base unit 10. The first exemplar solar concentrator photovoltaic assembly can be moved from the original location (at which the first exemplar solar concentrator photovoltaic assembly is fully assembled) to another location over the horizontal surface employing the skid 10A. For example, a forklift operator can insert blades of a forklift into the skid 10A and pick up the first exemplary solar concentrator photovoltaic assembly, and then move the first exemplary solar concentrator photovoltaic assembly to the other location and place the first exemplary solar concentrator photovoltaic assembly there. In an alternate embodiment loops are cast into the concrete base to allow the use of a hook attachment and thereby enable ease of movement using a crane.

In an alternate embodiment, the base unit 10 may not include a built-in skid, and a skid may be attached to the bottom surface of the base unit 10 at the time of placement of the base unit 10 at the location of the first operation of the first exemplary solar concentrator photovoltaic assembly.

In one embodiment, the features that enhance transportability of the first exemplary solar concentrator photovoltaic assembly can include at least one channel 12, which is incorporated into the base unit 12 at the time of construction of the base unit 12, e.g., at the time of constructing a mold for the base unit 12. The at least one channel 12 is raised over the bottommost planar surface of the base unit 10. The at least one channel 12 can extend from one sidewall of the base unit 10 to another sidewall of the base unit 10.

The first exemplary solar concentrator photovoltaic assembly can be moved from one location to another location employing at least one substantially horizontal blade that slides into the at least one channel 12. For example, a forklift having employing at least one substantially horizontal blade can be employed to move the first exemplary solar concentrator photovoltaic assembly.

In one embodiment, the features that enhance transportability of the first exemplary solar concentrator photovoltaic assembly can include a plurality of through-hole-including structures 70, which can be attached to the base unit 10 at the time of the assembling the first exemplary solar concentrator photovoltaic assembly. The plurality of through-hole-including structures 70 can include, for example, eye bolts that are bolted into corners of the top surface of the base unit 10. Subsequently, the base unit 10 can be moved from the location of initial assembly to another location by lifting the assembly employing a chain or a rope that passes through the plurality of through-hole-including structures 70.

Figure 3A:
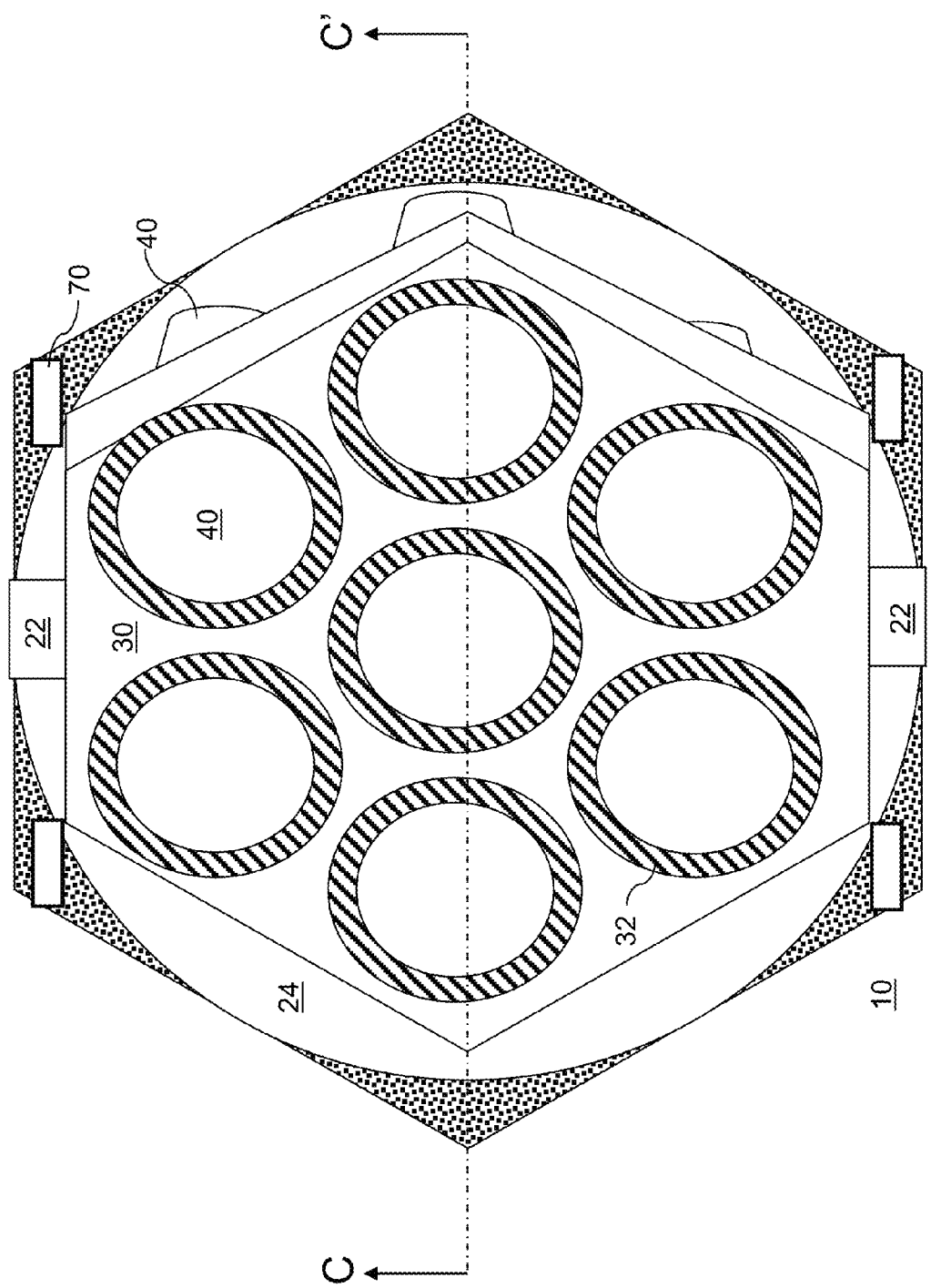
FIG. 3A is a top-down view of a second exemplary solar concentrator photovoltaic assembly in a tilted position according to an embodiment of the present disclosure.

Referring to FIGS. 3A-3C, a second exemplary solar concentrator photovoltaic assembly according to an embodiment of the present disclosure is illustrated in a tilted position. The second exemplary solar concentrator photovoltaic assembly is a transportable photovoltaic system. FIG. 3A is a top-down view, FIG. 3B is a side view, and FIG. 3C is a vertical cross-sectional view along the plane C-C' in FIG. 3A.

The second exemplary solar concentrator photovoltaic assembly can include tilt angle adjustment mount structures 22 configured to tilt the combination of the frame 30 and the plurality of solar concentrator photovoltaic devices 40 relative to a horizontal surface. Additionally or alternately, the second exemplary solar concentrator photovoltaic assembly can include an azimuthal angle adjustment mount structure 24 configured to rotate the combination of the frame 30 and the plurality of solar concentrator photovoltaic devices 40 within a horizontal plane. The azimuthal angle adjustment mount structure 24 can be attached to the top surface of the base unit 10. The tilt angle adjustment mount structure 22 and/or the azimuthal angle adjustment mount structure 24 collectively constitute at least one variable-angle mount structure that is configured to rotate the frame 30 around at least one axis relative to the base unit 10. Each of the at least one variable-angle mount structure 20 can include a powered actuator, which can be an electrically powered strut, a hydraulically powered strut, a pneumatically powered strut, and/or a combination thereof. Each of the variable-angle mount structure 20 can include a hinge, or any other mechanically equivalent mechanical structure that enable rotation of a first element attached to a first component of the variable-angle mount structure 20 relative to a second element attached to a second component of the variable-angle mount structure 20. The combination of a hinge (or an equivalent structure) and a powered actuator enables change of the at least one angle between the base unit 10 and the frame 30.

The shape and the size of the base unit 10 can be adjusted to accommodate the plurality of solar concentrator photovoltaic devices 40. A base unit 10 having hexagonal sidewalls are illustrated in the second exemplary solar concentrator photovoltaic assembly.

Figure 4:
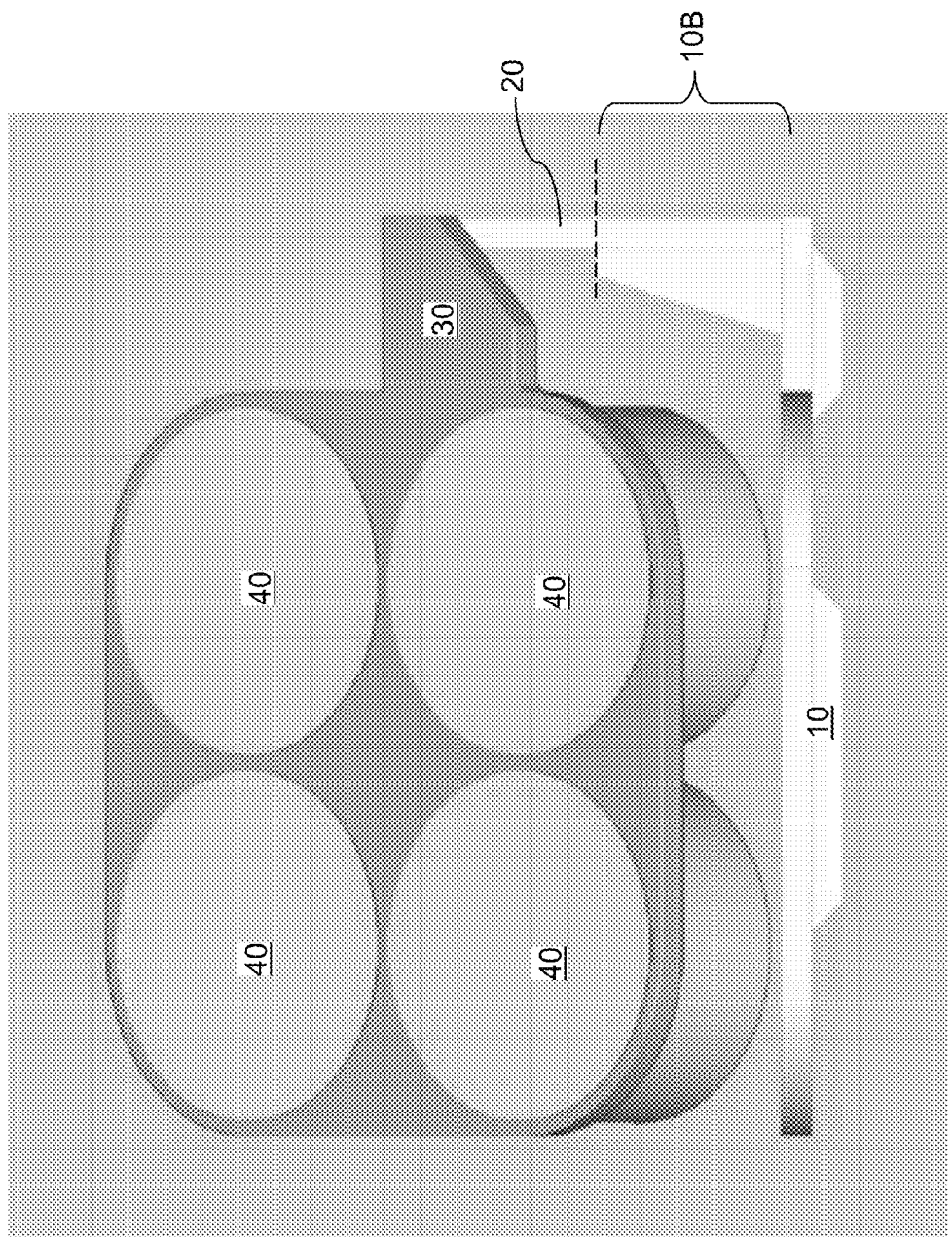
FIG. 4 is a schematic illustration of a third exemplary solar concentrator photovoltaic assembly in an operational position.
Figure 5:
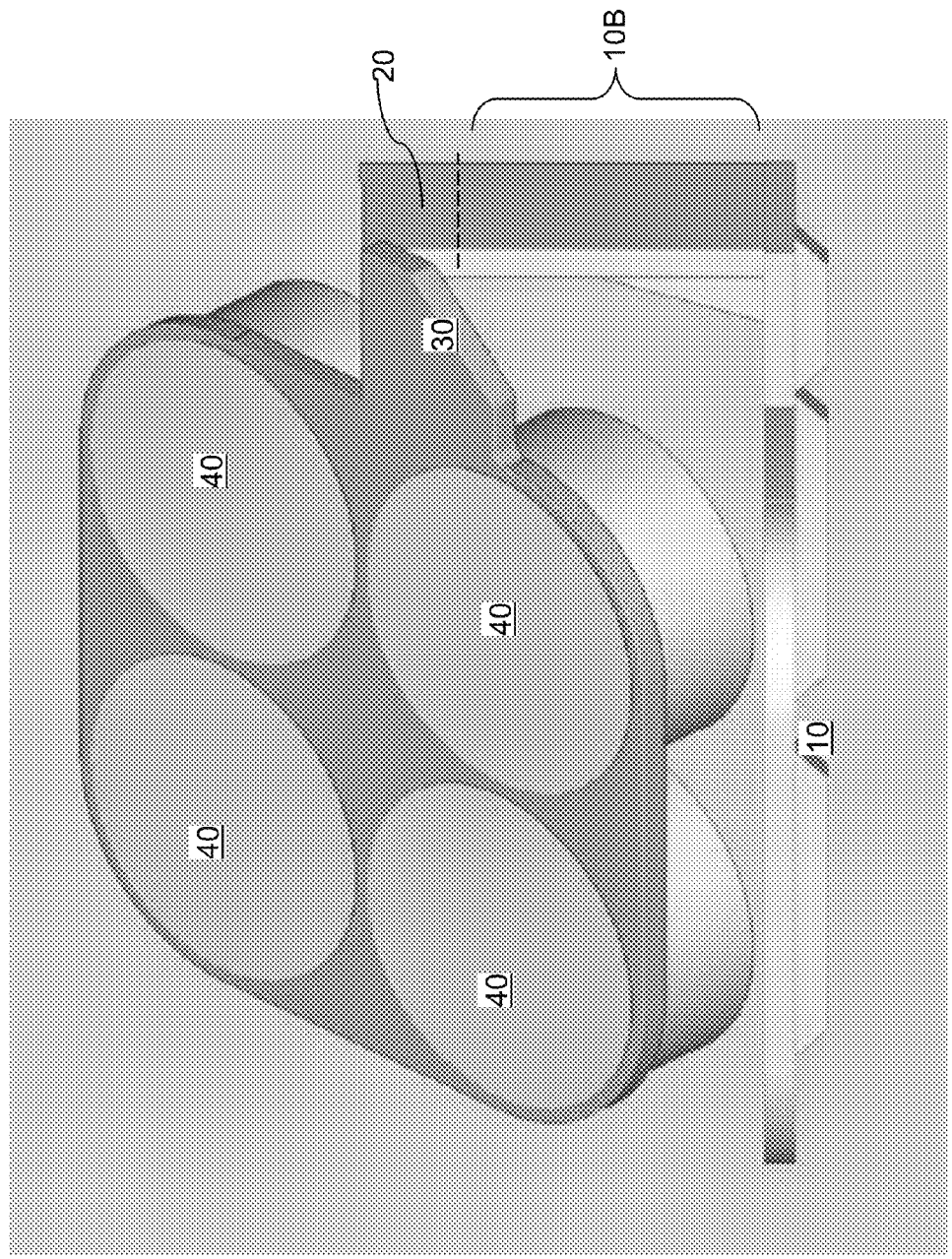
FIG. 5 is a schematic illustration of a fourth exemplary solar concentrator photovoltaic assembly in an operational position.

Further, the sidewalls of the base unit 10 are optional, and can be removed in some embodiments. FIG. 4 shows a schematic illustration of a third exemplary solar concentrator photovoltaic assembly in an operational position, which is a tilted and rotated position that faces the sun. Likewise, FIG. 5 shows a schematic illustration of a fourth exemplary solar concentrator photovoltaic assembly in an operational position, which is a tilted and rotated position that faces the sun. The third exemplary solar concentrator photovoltaic assembly and the fourth exemplary solar concentrator photovoltaic assembly are transportable photovoltaic systems.

The sidewalls of the base unit 10 in the first and second exemplary solar concentrator photovoltaic assemblies are replaced with a thin vertical strip 10B, which is a portion of the base unit 10 of the third exemplary solar concentrator photovoltaic assembly or a portion of the base unit 10 of the fourth exemplary solar concentrator photovoltaic assembly.

Figure 6A:
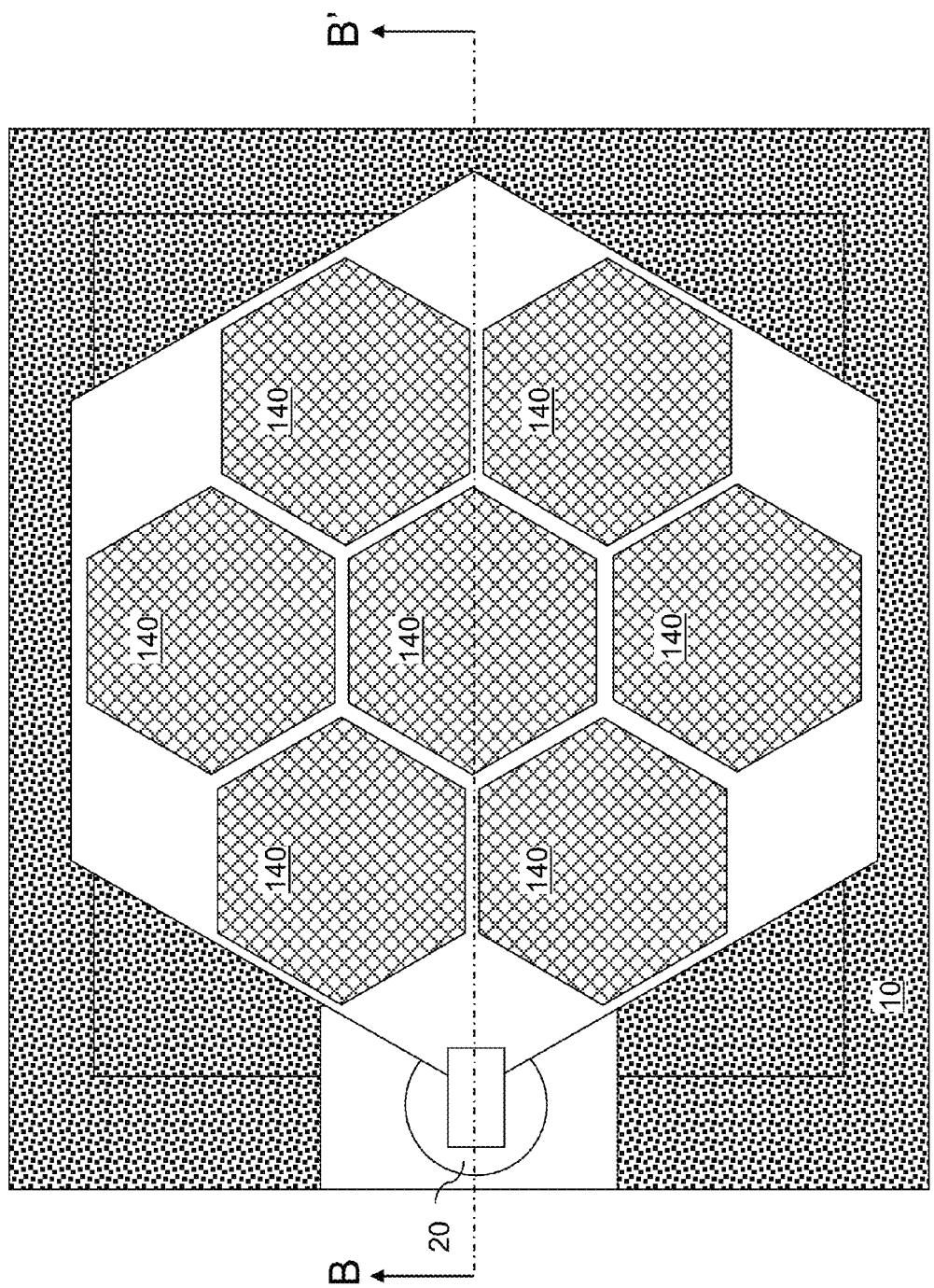
FIG. 6A is a top-down view of an exemplary flat panel photovoltaic assembly in a retracted position according to an embodiment of the present disclosure.
Figure 6E:
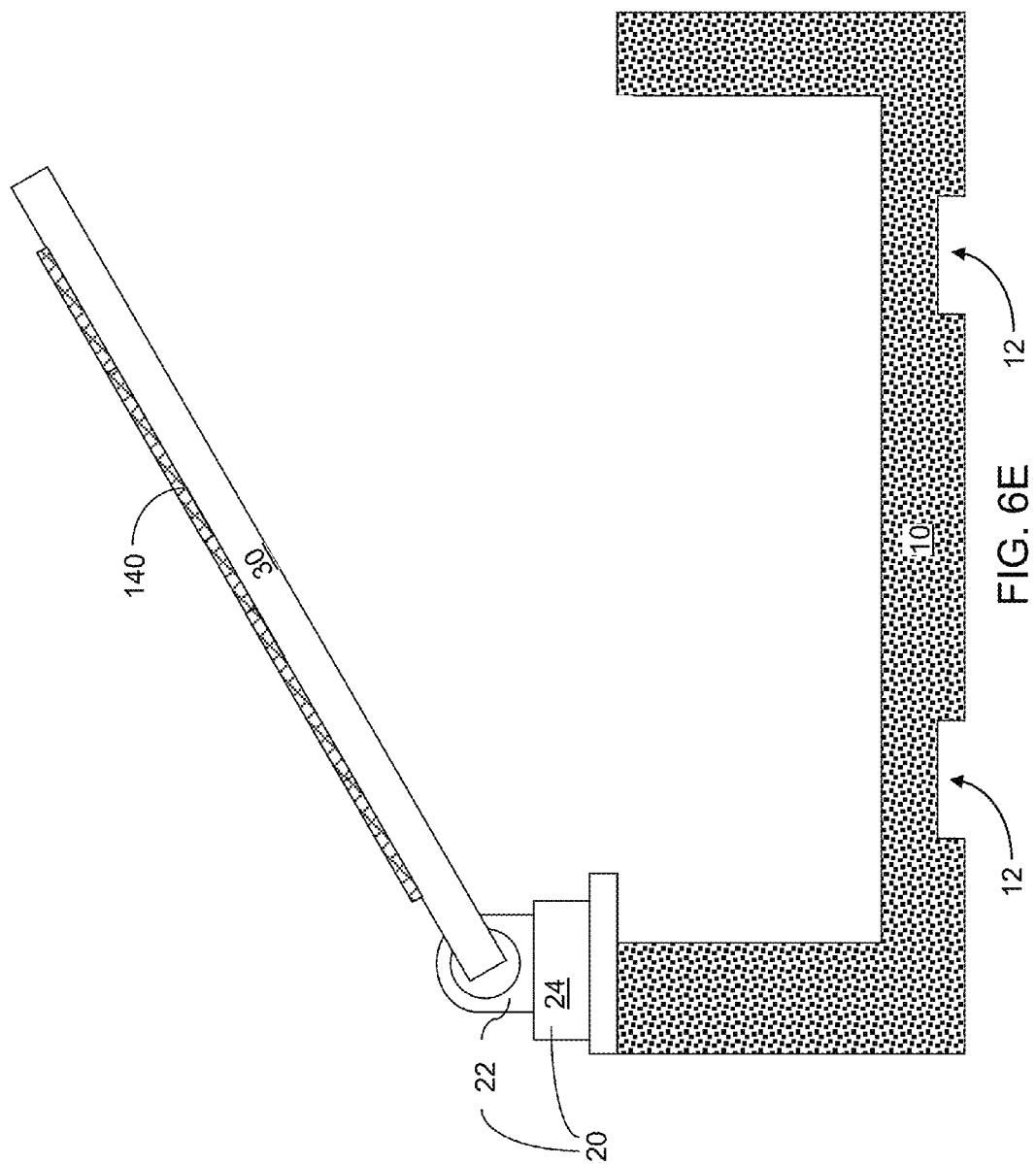
FIG. 6E is a side view of the exemplary flat panel photovoltaic assembly in a tilted position according to an embodiment of the present disclosure.
Figure 6F:
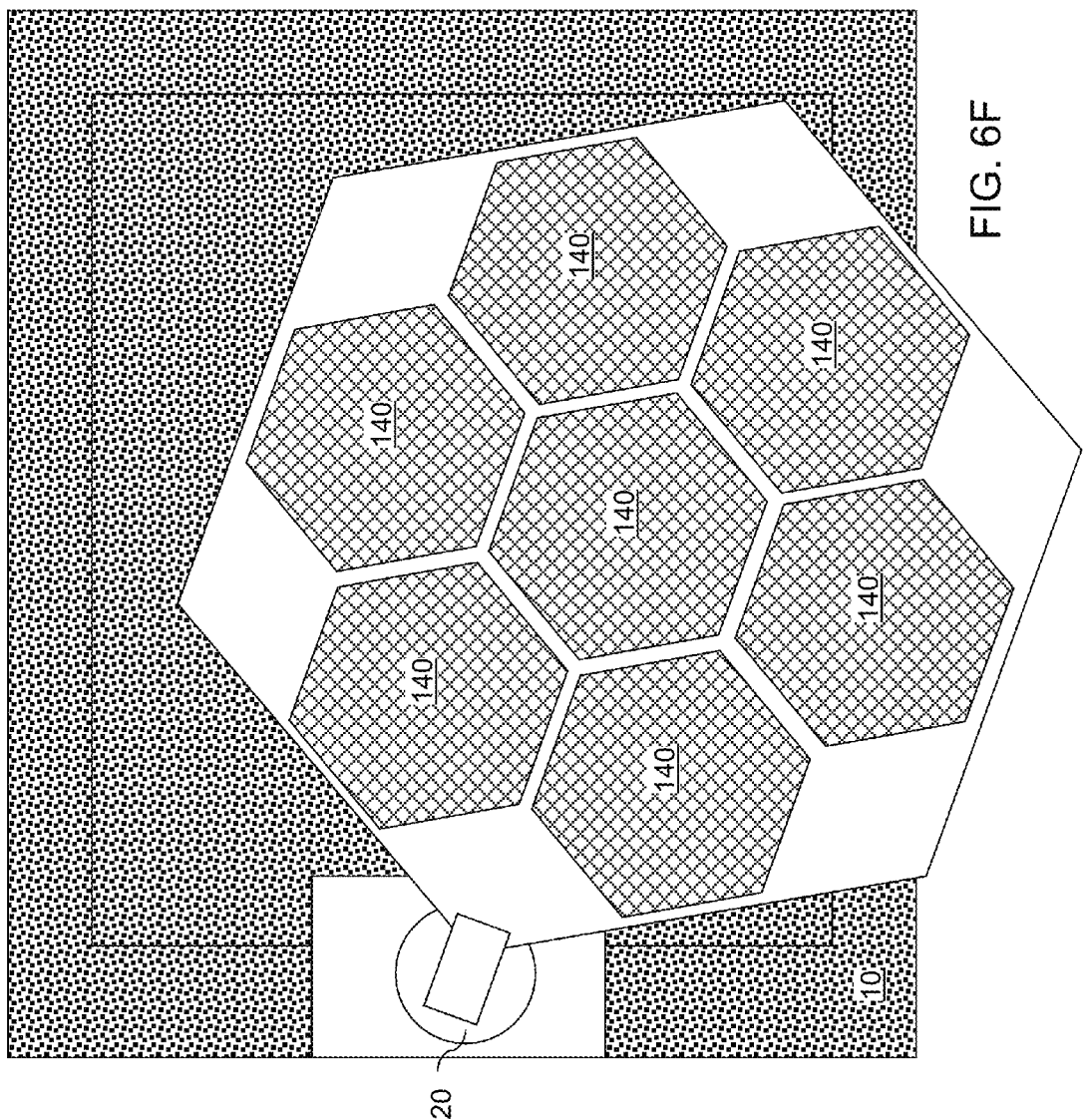
FIG. 6F is a top-down view of the exemplary flat panel photovoltaic assembly in an azimuthally rotated position according to an embodiment of the present disclosure.

Referring to FIGS. 6A-6F, an exemplary flat panel photovoltaic assembly according to an embodiment of the present disclosure is illustrated. The exemplary flat panel photovoltaic assembly is a transportable photovoltaic system. FIGS. 6A-6D illustrate the exemplary flat panel photovoltaic assembly in a retracted position in which the exemplary flat panel photovoltaic assembly is most compact. FIG. 6B is a side view, FIG. 6C is a vertical cross-sectional view along the plane C-C' in FIG. 6A, and FIG. 6D is a front view of the exemplary flat panel photovoltaic assembly in the retracted position. FIG. 6E illustrates the exemplary flat panel photovoltaic assembly in a tilted position in which the top surface of a frame 30 is at a non-zero angle from a vertical line. FIG. 6F illustrates the exemplary flat panel photovoltaic assembly in an azimuthally rotated position in which the frame 30 is rotated around an axis that is not parallel to a horizontal plane. This axis of rotation is vertical in FIG. 6F. In general, the frame 30 of the first exemplary solar concentrator photovoltaic assembly can be tilted and rotated by two independent angles.

The exemplary flat panel photovoltaic assembly can be derived from the first, second, third, or fourth exemplary solar concentrator photovoltaic assembly by substituting a flat panel photovoltaic device 140 for each of the solar concentrator photovoltaic device 40. Except for the difference between a plurality of flat panel photovoltaic devices 140 and a plurality of solar concentrator photovoltaic devices 40, the exemplary flat panel photovoltaic assembly can be assembled, transported, and operated in the same manner as the first, second, third, and fourth exemplary solar concentrator photovoltaic assemblies.

Because the base unit 10 is not affixed to ground, any surface, or any other fixture, the various photovoltaic assemblies of the present disclosure are transportable. Thus, the various photovoltaic assemblies of the present disclosure can be picked up from the site of the original assembly and initial operation, for example, by a crane, a forklift, or a working crew of a few people, and located into a standard shipping container to be shipped on land, on waterways, or in air in any vehicle configured to transport shipping containers.

Figure 7:
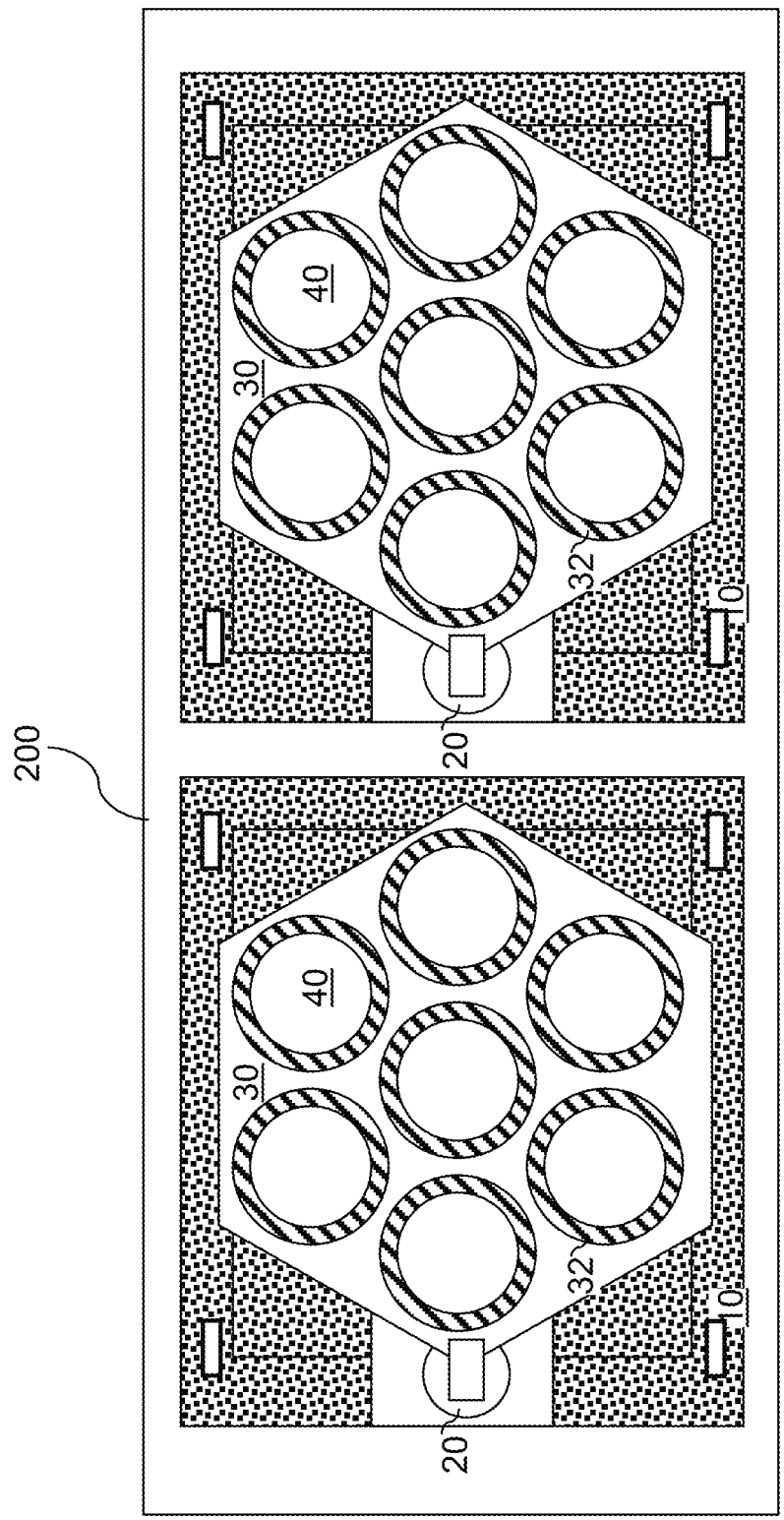
FIG. 7 is a top-down view of two first exemplary solar concentrator photovoltaic assemblies that are loaded into a standard shipping container. The hatched area represents the area of the standard shipping container.

FIG. 7 is a top-down view of two first exemplary solar concentrator photovoltaic assemblies that are loaded into a standard shipping container. The hatched area represents the area of the standard shipping container. In general, multiple photovoltaic assemblies, which can include any of the first, second, third, and fourth solar concentrator photovoltaic assemblies and/or one or more of the flat panel photovoltaic assemblies, can be loaded into a standard shipping container after initial assembly at a first operational site, i.e., the location at which the first assembly of the frame 40 and photovoltaic devices (40 or 140) are assembled.

In one embodiment, the size and shape of the base unit 10 and optionally, the size and shape of the solar concentrator photovoltaic devices 40 can be adjusted to fit in a standard shipping container employed for trucks. A standard shipping container has a width of 8 feet, a height of 9 feet and six inches, and a length of 48 feet or 53 feet.

In order to facilitate pick up of the various photovoltaic assemblies of the present disclosure by construction equipment or by a working crew, the base unit 10 of the various photovoltaic assemblies of the present disclosure can be provided with any hard points and/or slots known in the art for lifting with a forklift or a crane.

In one embodiment, the various photovoltaic assemblies can be provided with peripheral components (not shown) for immediate operation upon placement. Such a "drop and plug" operational mode can be enabled for the various photovoltaic assemblies by providing an automated control system (such as a computer), a power inverter that transforms an alternating current (AC) into a direct current (DC), and/or a battery storing sufficient electrical charge to enable positioning of the frame 30 and the plurality of photovoltaic devices (40 or 140). The battery can be employed to store sufficient to allow initial power up and orientation and stowage in emergency loss of load situations for the various photovoltaic assemblies of the present disclosure.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A transportable photovoltaic structure comprising an assembly of:
   a plurality of photovoltaic devices mounted to a frame containing mounting structures configured to hold said plurality of photovoltaic devices; and
   a base unit having a shape of a hollow box, wherein an end portion of said frame is attached to said hollow box through one variable-angle mount structure located on top of a sidewall of said hollow box such that a portion of each of said plurality of photovoltaic devices is embedded within said hollow box when said assembly is in a retracted position, wherein said variable-angle mount structure is configured to provide a pivot point to rotate said frame around two axes, wherein the pivot point is directly attached to the top of the sidewall of said hollow box with no intervening structures, and said base unit is configured to be placed on a horizontal surface without being affixed to said horizontal surface.

2. The transportable photovoltaic structure of claim 1, wherein said transportable photovoltaic structure is slidable over said horizontal surface.

3. The transportable photovoltaic structure of claim 1, wherein said assembly is not attached to any structure contiguously extending below said horizontal surface.

4. The transportable photovoltaic structure of claim 1, wherein said base unit comprises at least one channel that is raised over a bottom surface of said base unit and configured to accommodate at least one substantially horizontal blade within said at least one channel.

5. The transportable photovoltaic structure of claim 4, wherein said at least one channel extends from one sidewall of said base unit to another sidewall of said base unit.

6. The transportable photovoltaic structure of claim 1, wherein said base unit comprises a skid that is of contiguous and integral construction with other portions of said base unit.

7. The transportable photovoltaic structure of claim 1, wherein said frame has a first average density, and said base unit has a second average density, wherein said second average density is greater than said first average density.

8. The transportable photovoltaic structure of claim 1, wherein said base unit comprises cast concrete.

9. The transportable photovoltaic structure of claim 1, wherein said frame comprises a composite material including fibers and a matrix material in which said fibers are embedded.

10. The transportable photovoltaic structure of claim 1, wherein said one variable-angle mount structure includes at least one of an electrically powered strut, a hydraulically powered strut, and a pneumatically powered strut.

11. The transportable photovoltaic structure of claim 1, wherein each of said plurality of photovoltaic devices comprises a solar concentrator, a heat sink and a photovoltaic cell.

12. The transportable photovoltaic structure of claim 11, wherein said heat sink, said photovoltaic cell and a portion of said solar concentrator are located within said base unit when said assembly is in said retracted position.

13. The transportable photovoltaic structure of claim 1, wherein said base unit is attached to an outer portion of said frame that does not contain any of said plurality of said plurality of photovoltaic devices.

14. The transportable photovoltaic structure of claim 1, wherein said shape of said hollow box is square.

15. The transportable photovoltaic structure of claim 1, wherein said shape of said hollow box is hexagonal.

16. The transportable photovoltaic structure of claim 1, wherein said assembly further comprises a plurality of through-hole-including structures located on top of sidewalls of said base unit.

* * * * *